United States Patent
Savari

(10) Patent No.: US 6,456,209 B1
(45) Date of Patent: Sep. 24, 2002

(54) METHOD AND APPARATUS FOR DERIVING A PLURALLY PARSABLE DATA COMPRESSION DICTIONARY

(75) Inventor: Serap Ayse Savari, Chatham, NJ (US)

(73) Assignee: Lucent Technologies Inc., Murray Hill, NJ (US)

(*) Notice: Subject to any disclaimer, the term of this patent is extended or adjusted under 35 U.S.C. 154(b) by 0 days.

(21) Appl. No.: 09/277,638

(22) Filed: Mar. 26, 1999

Related U.S. Application Data

(60) Provisional application No. 60/110,396, filed on Dec. 1, 1998.

(51) Int. Cl.$^7$ ................................................. H03M 7/00
(52) U.S. Cl. ............................. 341/67; 341/50; 341/51; 341/65; 707/532
(58) Field of Search ........................ 717/3, 1; 341/51, 341/95, 107, 60, 50, 65, 67; 707/532; 704/204, 230, 530, 10

(56) References Cited

U.S. PATENT DOCUMENTS

| | | | | |
|---|---|---|---|---|
| 5,049,881 A | * | 9/1991 | Gibson et al. ................. | 341/95 |
| 5,353,024 A | * | 10/1994 | Graybill ....................... | 341/51 |
| 5,406,278 A | * | 4/1995 | Graybill et al. ............... | 341/51 |
| 5,530,645 A | * | 6/1996 | Chu ............................ | 707/532 |
| 5,617,552 A | * | 4/1997 | Garber et al. .................. | 711/1 |
| 5,652,581 A | * | 7/1997 | Furlan et al. .................. | 341/51 |
| 5,654,703 A | * | 8/1997 | Clark, II ....................... | 341/51 |
| 5,680,601 A | * | 10/1997 | Rust ............................ | 707/1 |
| 5,787,386 A | * | 7/1998 | Kaplan et al. .................. | 704/8 |
| 5,886,655 A | * | 3/1999 | Rust ............................ | 341/107 |
| 5,951,623 A | * | 9/1999 | Reynar et al. .................. | 708/203 |
| 5,973,630 A | * | 10/1999 | Heath .......................... | 341/87 |
| 5,999,949 A | * | 12/1999 | Crandall ....................... | 707/532 |
| 6,018,303 A | * | 1/2000 | Sadeh .......................... | 341/51 |
| 6,047,298 A | * | 4/2000 | Morishita ...................... | 707/532 |
| 6,067,381 A | * | 5/2000 | Benayoun et al. ............... | 382/232 |
| 6,100,824 A | * | 8/2000 | MacLeod et al. ............... | 341/51 |
| 6,121,901 A | * | 9/2000 | Welch et al. ................... | 341/51 |
| 6,195,465 B1 | * | 2/2001 | Zandi et al. ................... | 382/248 |
| 6,208,968 B1 | * | 3/2001 | Vitale et al. ................... | 704/260 |
| 6,233,580 B1 | * | 5/2001 | Kaplan et al. .................. | 707/101 |
| 6,292,115 B1 | * | 9/2001 | Heath .......................... | 341/87 |
| 6,301,394 B1 | * | 10/2001 | Trout .......................... | 382/244 |

OTHER PUBLICATIONS

Title: Investigation of the Error Performance of Tunstall Coding, IEEE, Briffa et al, 1998.*
Title: Parallel Algorithms for Data Compression, ACM, Smith et al, 1985.*
Title: A Text–Compression –Base Method for Code Size Minimization in Embedded System, Liao et al, ACM, Jan. 1999.*
H. Yamamoto, Competitively Optimal Variable–to–Fixed Length Codes, Proc. of Memorial Workshop for the 50$^{th}$ Anniv. of the Shannon Theory, IEEE (Jan. 22, 1999).

* cited by examiner

Primary Examiner—Kakali Chaki
Assistant Examiner—Chameli C. Das
(74) Attorney, Agent, or Firm—Ryan, Mason & Lewis, LLP

(57) ABSTRACT

A combinatorial approach is disclosed for analyzing a class of plurally parsable dictionaries for predictable, discrete, memoryless sources. A class of plurally parsable dictionaries are disclosed for a binary, memoryless source that outperforms the Tunstall code, when the probability of one of the symbols having a binary value of zero is sufficiently close to one. Given the probability of a symbol having a value equal to zero, $p_0$, and the desired size of the dictionary, M, a dictionary is derived that provides better compression than the Tunstall dictionary, if such a better dictionary exists. A Tunstall dictionary is initially selected having a size M—n, where $n \geq 1$. Thereafter, n all zero entries are added to the Tunstall dictionary. For the case where n equals one, the entry is comprised of a string of l zeroes. An equation is provided for obtaining the value of l. The improved dictionary is created by adding the all zero words ($0^l$ word for n=1) to the selected Tunstall dictionary.

12 Claims, 2 Drawing Sheets

METHOD AND APPARATUS FOR DERIVING A PLURALLY PARSABLE DATA COMPRESSION DICTIONARY

CROSS REFERENCE TO RELATED APPLICATIONS

This application claims the benefit of United States Provisional Application No. 60/110,396, filed Dec. 1, 1998.

FIELD OF THE INVENTION

The present invention relates to data compression techniques, and more particularly to methods and apparatus for deriving a dictionary for use by a data compression system.

BACKGROUND OF THE INVENTION

Lossless data compression attempts to map the set of strings from a given source into a set of predefined binary code strings so that each source string can be exactly reconstructed from its corresponding code string and some criterion about this mapping is optimized. One approach to studying lossless data compression algorithms assumes that there is a statistical model underlying the generation of source symbols. In this case, the most common primary objective in designing source codes is to minimize the average number of code symbols produced per source symbol. C. E. Shannon and W. Weaver, The Mathematical Theory of Communication, Univ. of Illinois Press, Urbana (1949), demonstrated that the expected number of code symbols per source symbol achieved by any lossless data compression technique is bounded from below by the binary entropy of the source. The redundancy of a source code is the amount by which the average number of code symbols per source symbol for that code exceeds the entropy of the source.

Many families of lossless data compression techniques have been devised and investigated. A variable-to-fixed length coder, for example, can be decomposed into a parser and a string encoder. The parser segments the source output into a concatenation of variable-length strings. Each parsed string, with the possible exception of the last one, belongs to a predefined dictionary with M entries; with the final parsed string being a non-null prefix of a dictionary entry. The string encoder maps each dictionary entry into a fixed-length codeword.

Variable-to-fixed length codes are considered to be particularly well-suited to compress data with a lot of predictability because dictionaries can be chosen so that there are long entries corresponding to frequently occurring strings. For a discussion of variable-to-fixed length codes and their suitability for compression of predictable data, see, for example, S. A. Savari, Variable-To-Fixed Length Codes for Predictable Sources, Proc. DCC '98, Snowbird, Utah (April 1998) and S. A. Savari, Predictable Sources and Renewal Theory, Proc. ISIT '98, Cambridge, Mass. (August 1998), each incorporated by reference herein.

Run-length codes were the first variable-length codes to be investigated, and these codes have long been recognized to be effective for binary, memoryless sources with small entropies. Tunstall considered the problem of generating an optimal variable-to-fixed length code for any discrete, memoryless source. B. P. Tunstall, Synthesis of Noiseless Compression Codes, Ph.D. Dissertation, Georgia Inst. Technology, Atlanta, Ga. (1967). Generalizations of the Tunstall code to sources with memory have been proposed, for example, in T. J. Tjalkens and F. M. J. Willems, Variable-To-Fixed Length Codes for Markov Sources, I.E.E.E. Trans. Information Theory, IT-33, 246–57 (1987), S. A. Savari and R. G. Gallager, Generalized Tunstall Codes for Sources with Memory, I.E.E.E. Trans Information Theory, IT-43, 658–68 (1997) and S. A. Savari, Variable-To-Fixed Length Codes and the Conservation of Entropy, Proc. ISIT '95, Whistler, Canada (1995). The Lempel-Ziv codes are universal variable-to-fixed length codes that have become virtually standard in practical lossless data compression.

Run-length codes and the generalized Tunstall codes for sources with memory use dictionaries that have the property that any source sequence has a unique prefix in the dictionary. Under this assumption, Tunstall codes are the optimal variable-to-fixed length codes for discrete memoryless sources. A dictionary is said to be uniquely parsable if every source string, even those of zero probability, can be uniquely parsed into a concatenation of dictionary entries with a final string that is a non-null prefix of a dictionary entry. For example, consider a ternary source having the alphabet {0, 1, 2}. If the dictionary is {00, 1, 2}, the dictionary is not uniquely parsable because any source string beginning with the letters 0 1 cannot be parsed. The dictionary {00, 01, 02, 1, 2}, is uniquely parsable. However, adding the string 000 to the previous dictionary results in a new dictionary that is not uniquely parsable because the string 0 0 0 1 can either be segmented as (000)(1) or as (00)(01). This dictionary is said to be plurally parsable. It is noted that for a plurally parsable dictionary, a parsing rule must be specified to avoid ambiguities during the segmentation of the source string.

For any real number x, let ⌈x⌉ denote the smallest integer greater than or equal to x. As the length of the encoded source string increases, the number of code letters per source letter corresponding to a dictionary with M words and expected number $L_M$ of source letters per dictionary string approaches $[\log_2 M]/L_M$ with probability one. Thus, an optimal dictionary with M entries maximizes the average number $L_M$ of source letters per dictionary string.

Tunstall found a very simple algorithm to construct the optimal uniquely parsable dictionary with M entries. It is often convenient to picture the entries of a dictionary as the leaves of a rooted tree in which the root node corresponds to the null string, each edge is a source alphabet symbol, and each dictionary entry corresponds to the path from the root to a leaf. The tree corresponding to a uniquely parsable dictionary is complete in the sense that every intermediate node in the tree has a full set of edges coming out of it. For a dictionary with M entries, $L_M$ can be interpreted as the expected length of the dictionary tree. It is known that for a uniquely parsable dictionary, $L_M$ is the sum of the probabilities associated with each intermediate node in the tree, including the root. Therefore, an optimal uniquely parsable dictionary will correspond to a set of intermediate nodes with maximal probabilities. Unique parsability implies that for a discrete, memoryless source with an alphabet of size K, $M=\alpha(K-1)+1$ for some integer $\alpha$. Here, $\alpha$ is the number of intermediate nodes in the dictionary tree, including the root.

The Tunstall algorithm given below finds the optimal uniquely parsable dictionary for a discrete, memoryless source with an alphabet of size K:

1. Start with each source symbol as a dictionary entry.
2. If the total number of entries is less than M, then go to step 3, else stop.
3. Take the most probable entry $\sigma$ and replace it with the K strings that are single letter extensions of $\sigma$. Do not alter the other entries. Go to step 2.

In practice, many variable length codes such as the Lempel-Ziv-Welch code use dictionaries that are plurally parsable. In other words, each source sequence can be segmented into a concatenation of dictionary entries in at least one way, and there exist source sequences that can be parsed into a concatenation of dictionary entries in two or more ways. At a parsing point, the most common rule for designating the next parsed phrase from a plurally parsable dictionary is to select the longest dictionary entry that is a prefix of the unparsed source output.

A need exists for a plurally parsable dictionary that yields a significantly larger average length of a parsed string than that of the Tunstall dictionary of the same size.

SUMMARY OF THE INVENTION

Generally, a combinatorial approach is disclosed for analyzing a class of plurally parsable dictionaries for predictable, discrete, memoryless sources. A class of plurally parsable dictionaries are disclosed for a binary, memoryless source that outperforms the Tunstall code, when the probability of one of the symbols having a binary value of one is sufficiently close to one. For sources with a very small probability of a symbol having a value equal to one, $p_1$, the Tunstall dictionary is inefficient, since all but one of the Tunstall dictionary entries ends with a one and each such entry is rarely used.

According to a feature of the invention, a dictionary derivation process derives a dictionary that provides better compression than the Tunstall dictionary, if such a better dictionary exists, given the probability of a symbol having a value equal to zero, $p_0$, and the desired size of the dictionary, M. Generally, the dictionary derivation process selects a Tunstall dictionary having a size M−n, where n≧1. Thereafter, all n zero entries are added to the Tunstall dictionary. For the case where n equals one, the entry is comprised of a string of l zeroes. The value of l is obtained from the following equation, where l=i x (M−2):

$$r(i-1) \leq p_0^{M-2} \leq r(i),$$

where r(k) is the positive real root of the equation:

$$\sum_{j=0}^{k} x^j = k$$

The improved dictionary is created by adding the all zero words ($0^l$ word for n=1) to the selected Tunstall dictionary. A more complete understanding of the present invention, as well as further features and advantages of the present invention, will be obtained by reference to the following detailed description and drawings.

DETAILED DESCRIPTION

Figure 1:
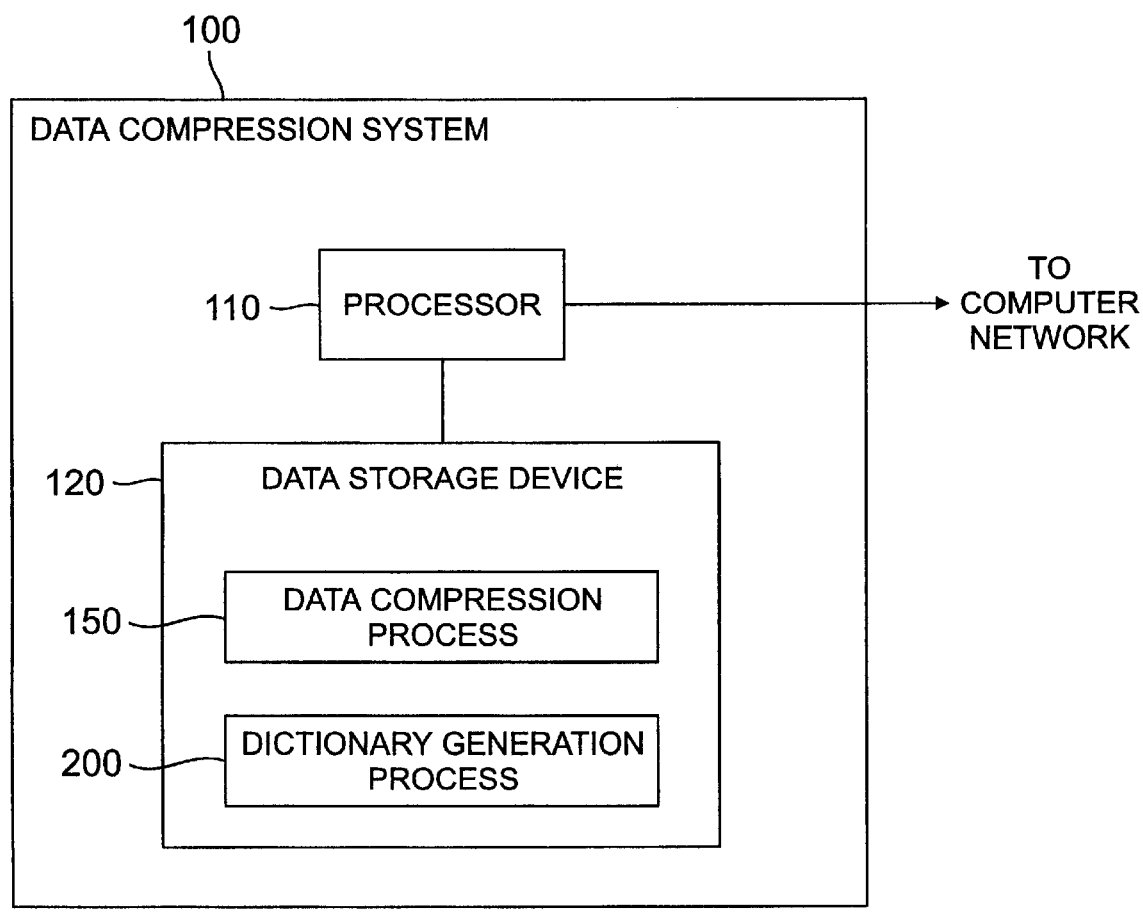
FIG. 1 is a block diagram showing the architecture of an illustrative data compression system in accordance with the present invention.

A data compression system 100 according to the present invention is shown in FIG. 1. As discussed further below, the data compression system 100 derives a dictionary that provides better compression than the Tunstall dictionary, if such a better dictionary exists, given the probability of a 0, $p_0$, for a given binary, memoryless data source, and the desired size of the dictionary, M.

Generally, an improved dictionary of size M is derived in accordance with the present invention by starting with the Tunstall dictionary of size a size less than M, such as (M−1), and adding at least one entry of all zeroes, having a length l ($0^l$ denote the string of l zeroes).

FIG. 1 is a block diagram showing the architecture of an illustrative data compression system 100 in accordance with the present invention. The data compression system 100 may be embodied as a general purpose computing system, such as the general purpose computing system shown in FIG. 1. The data compression system 100 includes a processor 110 and related memory, such as a data storage device 120, which may be distributed or local. The processor 110 may be embodied as a single processor, or a number of local or distributed processors operating in parallel. The data storage device 120 and/or a read only memory (ROM) are operable to store one or more instructions, which the processor 110 is operable to retrieve, interpret and execute.

The data storage device 120 preferably includes a data compression process 150, such as MNP-5, commercially available from Microcom Corp. In addition, the data storage device 120 includes a dictionary derivation process 200, discussed below in conjunction with FIG. 2, in accordance with the present invention. As discussed further below, given the probability of a 0, $p_0$, and the desired size of the dictionary, M, the dictionary derivation process 200 derives a dictionary that provides better compression than the Tunstall dictionary, if such a better dictionary exists.

Optimal Dictionary with Three Entries (M=3)

In the illustrative embodiment, a dictionary with three entries is considered. For a binary, memoryless source with alphabet $\{0, 1\}$, let $p_i$, $i \in \{0, 1\}$, denote the probability that the source emits symbol i. It is assumed that $p_0 \geq p_1$. The illustrative embodiment considers the optimal dictionary of size three. The Tunstall dictionary for this source is $\{00, 01, 1\}$ and the expected number of source letters per dictionary string is $1+p_0$. For sources with very small $p_1$, the code is inefficient because the strings 01 and 1 are rarely used. Let $0^l$ denote the string of l zeroes. As the probability of a zero, $p_0$, approaches one, the string of l zeroes $0^l$ grows. Any plurally parsable dictionary that has a larger expected length of a parsed string than the Tunstall dictionary must be of the form $\{0, 0^l, 1\}$ for some integer $l \geq 2$. To analyze this code, the steady-state behavior of a Markov chain is studied with a set of states $\{0^l, 1, 0_1, \ldots, 4\,0_{l-1}\}$. Here, $0^l$ and 1 are the states of the Markov chain when the next parsed source string is $0^l$ and 1, respectively, and for $1 \leq i \leq l-1$, $0_i$ is the state of the chain when the unparsed source output has exactly i zeroes before the next one. Let $\pi_\gamma$ represent the steady-state probability that the Markov chain is in state $\gamma$. Then, $$\pi_{0^l} = p_0^l \cdot \pi_{0^l} + p_0^l \cdot \pi_1$$

$$\pi_{0_{l-1}} = p_0^{l-1} p_1 \cdot \pi_{0^l} + p_0^{l-1} p_1 \cdot \pi_1$$

$$\pi_{0_i} = p_0^i p_1 \cdot \pi_{0^l} + p_0^i p_1 \cdot \pi_1 + \pi_{0_{i+1}}, \quad 1 \leq i \leq l-2$$

$$\pi_1 = p_1 \cdot \pi_{0^l} + p_1 \cdot \pi_{0_1}$$

Since $$\pi_{0^l} + \pi_1 + \sum_{i=1}^{l-1} \pi_{0_i} = 1,$$

it is straightforward to verify the following:

$$\pi_{0^l} = \frac{p_1}{(1/p_0)^l - 1 - p_1(l-1)} \qquad \text{Eq. (1)}$$

$$\pi_0 = \sum_{i=1}^{l-1} \pi_{0_i} = \frac{(1/p_0)^{l-1} - 1 - p_1(l-1)}{(1/p_0)^l - 1 - p_1(l-1)} \qquad \text{Eq. (2)}$$

$$\pi_1 = \frac{p_1((1/p_0)^l - 1)}{((1/p_0)^l - 1 - p_1(l-1))} \qquad \text{Eq. (3)}$$

and hence, $$E[L] = \pi_0 + \pi_1 + l \cdot \pi_{0^l} \qquad \text{Eq. (4)}$$
$$= \frac{(1/p_0)^l - 1}{(1/p_0)^l - 1 - p_1(l-1)} = \left(1 - \frac{p_1(l-1)}{(1/p_0)^l - 1}\right)^{-1}$$

To maximize the expected length of a parsed string, the integer, $l \geq 1$, that maximizes equation number 4 must be found. This is the smallest integer $l \geq 2$ for which the following holds true:

$$\frac{l-1}{(1/p_0)^l - 1} \geq \frac{l}{(1/p_0)^{l+1} - 1},$$

or equivalently, $$p_0^{l+1} + p_1 l - 1 = p_1 \left(l - \sum_{i=0}^{l} p_0^i\right) \geq 0. \qquad \text{Eq. (5)}$$

Let $r(1)=0.5$ and for $l \geq 2$, let $r(l)$ be the positive root of the following equation:

$$\sum_{i=0}^{l} x^i = l. \qquad \text{Eq. (6)}$$

For example, $$r(2) = \frac{-1 + \sqrt{5}}{2} \approx 0.618033988$$

$$r(3) = \frac{1}{3}\left(\sqrt[3]{\frac{3\sqrt{417} + 61}{2}} - \sqrt[3]{\frac{3\sqrt{417} - 61}{2}} - 1\right)$$

$$\approx 0.810535713$$

$r(4) \approx 0.888179668$.

It follows from Equation 5 that that optimal choice of $l$ is determined by:

$r(l-1) \leq p_0 \leq r(l)$

From Equation 4, it follows that the dictionary $\{0, 0^l, 1\}$ has a larger average length of a parsed string than the Tunstall dictionary $\{00, 01, 1\}$, when $$\left(1 - \frac{p_1(l-1)}{(1/p_0)^l - 1}\right)^{-1} = \left(1 - \frac{p_0^l(l-1)}{\sum_{i=0}^{l-1} p_0^i}\right)^{-1} > 1 + p_0 \qquad \text{Eq. (7)}$$

From Condition 7, it can be seen that the dictionary $\{0, 00, 1\}$ always has a smaller expected length of a parsed string than the Tunstall dictionary. When $l=3$, condition (7) is satisfied when $$p_0 > \sqrt[3]{\frac{11}{54} + \frac{\sqrt{177}}{72}} + \sqrt[3]{\frac{11}{54} - \frac{\sqrt{177}}{72}} - \frac{1}{6} \approx 0.829483541 \qquad \text{Eq. (8)}$$

The dictionary $\{0, 0000, 1\}$ is better than $\{00, 0\ 1\}$ when $$p_0 > x(1) = \qquad \text{Eq. (9)}$$

$$\sqrt[3]{\frac{245}{1458} + \frac{\sqrt{741}}{162}} + \sqrt[3]{\frac{245}{1458} + \frac{\sqrt{741}}{162}} + \frac{1}{9}$$

$$\approx 0.824122621$$

Conditions 5 to 9 imply that the optimal plurally parsable dictionary has a larger average length of a parsed string than the Tunstall dictionary if and only if $p_0 > x(1)$.

To understand the performance of the optimal plurally parsable dictionary as $p_0$ approaches one, equation 4 is maximized and the integer constraint is ignored. Thus, $$\frac{d}{dl}\left(\frac{l-1}{(1/p_0)^l - 1}\right) = \frac{(1/p_0)^l - 1 - (l-1) \cdot (1/p_0)^l \ln(1/p_0)}{((1/p_0)^l - 1)^2} \qquad \text{Eq. (10)}$$

The value of $l$, say $l^*$, for which the right-hand side of equation (10) is equal to zero is desired. It is possible to show that for $p_0$ very close to one, $$l^* = \sqrt{\frac{2}{\ln(1/p_0)}} + \frac{1}{3} + \frac{o\left(\sqrt{\ln(1/p_0)}\right)}{\sqrt{\ln(1/p_0)}}. \qquad \text{Eq. (11)}$$

For $l=l^*$, equations 1 through 4, 10 and 11 can be used to show that:

$$E[L] = \sqrt{\frac{1}{2\ln(1/p_0)}} + \frac{1}{12} + \frac{o(\ln(1/p_0))}{\ln(1/p_0)}$$

$$\pi_{0^l} = \frac{1}{2} - \frac{7}{24}\sqrt{2\ln(1/p_0)} + o\left(\sqrt{\ln(1/p_0)}\right)$$

$$\pi_0 = \frac{1}{2} - \frac{5}{24}\sqrt{2\ln(1/p_0)} + o\left(\sqrt{\ln(1/p_0)}\right)$$

$$\pi_1 = p_1 \cdot E[L] = \frac{1}{2} - \frac{7}{24}\sqrt{2\ln(1/p_0)} + o\left(\sqrt{\ln(1/p_0)}\right)$$

It is noted that as $p_0$ approaches one, $E[L]$ grows without bound, in contrast to the expected length of the Tunstall dictionary. Furthermore, the dictionary entries are much closer to the ideal of being equiprobable than the entries of the Tunstall dictionary.

Renewal Theory Approach to Dictionary Analysis

The steady-state behavior of any plurally parsable dictionary can be found using a Markov chain analysis similar to the one employed above. Unfortunately, this type of analysis generally appears to be quite cumbersome.

For a subset of the collection of plurally parsable dictionaries, there is an alternate approach to obtaining steady-state behavior. The present invention focuses on dictionaries with the property that any entry contains at most one 1, and any entry that contains a 1 ends with it. For example, the dictionaries $\{0, 0^i, 1\}$ and $\{00, 01, 1\}$ considered above satisfy this condition, but the dictionaries $\{0, 1, 010\}$ and $\{0, 1, 011\}$ do not. This constraint is reasonable when designing small to moderate dictionaries for binary sources in which ones occur very rarely.

Any plurally parsable dictionary satisfying the aforementioned requirement on ones has the property that each appearance of a one in the source output string corresponds to the end of a parsed phrase. Because the ones in the source sequence correspond to regeneration points in the parsing process, these dictionaries lend themselves to an analysis based on renewal theory.

$E[L]$, the steady-state average length of a parsed phrase, is represented as a function of $E[R]$, the expected number of parsed phrases after a one up to and including the parsed phrase finished by the next one in the sequence. To this end, the following notation is introduced. $S_0=0$, $S_n$, $n \geq 1$, denotes the position in the source sequence of the nth one. $T_n = S_{n+1} - S_n$, $n \geq 0$. $u_i$, $i \geq 1$, symbolizes the $i^{th}$ source output symbol. $R_n$, $n \geq 0$, represents the number of parsed phrases among the substring $u_{S_n+1}, \ldots, u_{S_{n+1}}$, i.e., the string $0^{T_n-1}1$. $N(k)$ denotes the number of ones among the first k parsed phrases. $L_k$ symbolizes the length of the $k^{th}$ parsed phrase. Because of the memoryless nature of the source, the "inter-one" times $T_n$ are independent and identically distributed random variables. It is easily shown that $E[T_n]=1/p_{1.Rn}$ is a deterministic function of $T_n$. We have $$S_{N(k)} \leq L_1 + \ldots + L_K < S_{N(k)+1}.$$

Thus, $$\frac{T_0 + T_1 + \ldots + T_{N(k)-1}}{N(k)} \cdot \frac{N(k)}{k} \leq$$

$$\frac{L_1 + \ldots + L_k}{k} < \frac{T_0 + T_1 + \ldots + T_{N(k)}}{N(k)} \cdot \frac{N(k)}{k}.$$

The strong law of large numbers implies that $$\lim_{k \to \infty} \frac{L_1 + \ldots + L_k}{k} = E[L]$$

$$\lim_{k \to \infty} \frac{T_0 + T_1 + \ldots + T_{N(k)-1}}{N(k)} = \frac{T_0 + T_1 + \ldots + T_{N(k)}}{N(k)} = E[T] = \frac{1}{p_1}$$

$$\lim_{k \to \infty} \frac{N(k)}{k} = \frac{1}{E[R]}.$$

Thus, for any plurally parsable dictionary in which each appearance of a one corresponds to the end of a parsed phrase, $$E[L] = \{p_1 E[R]\}^{-1}, \quad \text{Eq. (12)}$$

and we need only calculate $E[R]$, which usually involves a combinatorial argument.

Designing Plurally Parsable Dictionaries for Very Predictable Sources

To obtain the optimal dictionary of size M+2, M>2, assuming that $p_0^M > p_1$, then the Tunstall dictionary for this source is $\{0^{M+1}, 0^M 1, 0^{M-1}1, \ldots 01, 1\}$, and the average length of a parsed phrase is $1+p_0+ \ldots +p_0^M = (1-p_0^{M+1})/p_1$.

A collection of M alternate dictionaries is proposed to be considered for this source. For $n \in \{2, \ldots, M+1\}$, Dictionary n consists of the entries of the Tunstall dictionary of size n for this source, i.e., $\{0^{n-1}, 0^{n-2}1, \ldots, 1\}$, and M+2-n all-zero words with lengths bounded from below by n. As $p_0$ increases towards one, the optimal dictionary will have an non-decreasing number of all-zero entries. In the following discussion, the optimal choice of the all-zero words for Dictionary M+1 and Dictionary 2 will be discussed.

Dictionary M+1

The entries of Dictionary M+1 are $\{0^M, 0^{(i-1)M+j}, 0^{M-1}1, \ldots, 01, 1\}$ for some choice of i>2 and $j \in \{1, \ldots, M\}$. It follows from Equation 12 that maximizing the steady-state expected length of a parsed phrase is equivalent to minizimizing $E[R]$, the average number of parsed phrases after a one up to and including the parsed phrase ended by the next occurrence of a one. Since $p_0^k p_1$ is the probability that $0^k 1$ is the first substring to end in a one, then:

$$E[R] = \sum_{k=0}^{\infty} p_0^k p_1.$$

[Number of phrases in the parsing of $0^k 1$].

To count the number of parsed phrases for the string $0^k 1$, recall that the parsing rule chooses the longest dictionary entry that is a prefix of the unparsed portion of the string. Thus, for $0 \leq k \leq M-1$, there is one parsed phrase, for $M \leq k \leq 2M-1$, there are two parsed phrases, $\ldots$, for (i-2) $M \leq k \leq (i-1)M-1$, there are i parsed phrases, for (i-1) $M \leq k \leq (i-1)M+j-1$, there are i+1 parsed phrases, for (i-1) $M+j \leq k \leq iM+j-1$, there are two parsed phrases, for $iM+j \leq k \leq (i+1) M+j-1$, there are three parsed phrases, and so on. Carrying out the calculation, then $$E[R] = \frac{1 - p_0^{iM}}{(1-p_0^M)(1-p_0^{(i-1)M+j})} - \frac{(i-1)p_0^{(i-1)M+j}}{(1-p_0^{(i-1)M+j})} \quad \text{Eq. (13)}$$

It is straightforward to demonstrate that for any fixed choice of i, the value of $j \in \{1, 2, \ldots, M\}$ that minimizes the right-hand side of Equation 13 is j=M. Hence, only dictionaries of the form $\{0^M, 0^{iM}, 0^{M-1}1, \ldots, 01, 1\}$ for some $i \geq 2$ are considered. By Equations 12 and 13, the average length of a parsed phrase for this dictionary is:

$$E[L] = \left( \frac{p_1}{(1-p_0^M)} - \frac{p_1(i-1)}{(1/p_0^M)^i - 1} \right)^{-1} \quad \text{Eq. (14)}$$

By the same argument used to find the optimal plurally parsable dictionary of size three, the optimal choice of i can be determined by:

$$r(i-1) \leq p_0^M \leq r(i) \quad \text{Eq.(15)}$$

where r(k) was defined by Equation 6. Equation 15 is written for M+2, and can be rewritten for a dictionary of M words as follows:

$$r(i-1) \leq p_0^{M-2} \leq r(i) \quad \text{Eq.(15A)}$$

It follows from Equation 14 that the dictionary $\{0^M, 0^{iM}, 0^{M-1}1, \ldots, 01, 1\}$ outperforms the Tunstall dictionary of the same size when:

$$\frac{(i-1)p_0^{(i-1)M}(1-P_0^{M+1})}{1-p_0^{iM}} \geq \frac{1-p_0}{1-p_0^M}. \qquad \text{Eq. (16)}$$

$$\frac{(i-1)p_0^{(i-1)(M-2)}(1-P_0^{M-1})}{1-p_0^{i(M-2)}} \geq \frac{1-p_0}{1-p_0^{M-2}}. \qquad \text{Eq. (16A)}$$

Equation 16 is written for M+2, and can be rewritten for a dictionary of M words as follows:

$$(i-1)p_0^{(i-1)(M-2)}(1-p_0^{M-1})/1-p_0^{i(M-2)} \geq 1-p_0/1-p_0^{M-2}. \qquad \text{Eq. (16A)}$$

For M=2, it is possible to use equations 15 and 16 to show that {00, 0000, 01, 1} is never an optimal dictionary of size 4. The optimal choice of dictionary {00, 0$^{2i}$, 01, 1} has a larger expected parsed phrase length than the Tunstall dictionary {000, 001, 01, 1} when $p_0$ exceeds the appropriate real root of the equation:

$$x - x^2 + 2x^4 = 1, \qquad \text{Eq.(17)}$$

which is approximately 0.805883149.

For M≧3, the dictionary {$0^M, 0^{2M}, 0^{M-1}1, \ldots, 01, 1$} will have a larger average parsed phrase size than the Tunstall dictionary with M+2 entries when $p_0$ is greater than the appropriate real root x(M) of the equation:

$$x + x^{M+1} - x^{2M+1} = 1, \qquad \text{Eq.(18)}$$

Hence, the optimal choice of dictionary {$0^M, 0^{iM}, 0^{M-1}1, \ldots, 01, 1$} will outperform the Tunstall dictionary when $p_0$>x(M). Thus, $x(3) \approx 0.800094994$ $x(4) \approx 0.804280407$ $x(5) \approx 0.813459173$ $x(6) \approx 0.823379752$ $x(7) \approx 0.832850953$ Let $M(p_0)$ denote the set of dictionary sizes for which the optimal plurally parsable dictionary has a larger expected parsed phrase length than the Tunstall dictionary of the same size. Let x(1) be given by equation 9. Thus, the present invention derives a plurally parsable dictionary with the following dictionary sizes that outperforms the Tunstall dictionary of the same size:

If $x(3) \leq p_0 < x(4)$, then $M(p_0) \supseteq \{5\}$.

If $x(4) \leq p_0 < x(2)$, then $M(p_0) \supseteq \{5,6\}$.

If $x(2) \leq p_0 < x(5)$, then $M(p_0) \supseteq \{4,5,6\}$.

If $x(5) \leq p_0 < x(6)$, then $M(p_0) \supseteq \{4,5,6,7\}$.

If $x(6) \leq p_0 < x(1)$, then $M(p_0) \supseteq \{4,5,6,7,8\}$.

For $p_0 > x(1)$, with x(1) defined by equation 9, let B and $\delta \in (0, 1)$ be given by:

$P_0^B + p_0 = 1$ $P_0^{B-3+\delta} + p_0^{2-\delta} = 1$.

For $M \leq B-3+\delta$, we have that:

$$P_0 + p_0^{M+1} - p_0^{2M+1} \geq p_0 + p_0^{B-2+\delta} - p_0^{2B-5+2\delta} = 1 - P_0^B + p_0^{B-2+\delta} + p_0^{2B-5+2\delta}$$
$$2\delta = 1 \qquad \text{Eq.(19)}$$

For any real number x, let $\lfloor x \rfloor$ denote the smallest integer less than or equal to x. It follows from equations 9 and 17 through 19 that for $p_0 > x(1)$, there is a plurally parsable dictionary with N entries that performs at least as well as the Tunstall dictionary of the same size when $3 \leq N \leq \lfloor B+\delta \rfloor - 1$.

Dictionary 2

Some preliminary results are outlined here. Generally, Dictionary 2 will have entries {$1, 0, 0^{l_1}, 0^{l_2}, \ldots, 0^{l_M}$} for some choice of integers $2 < l_1 < l_2 < \ldots < l_M$. In the special case where there are integers $n_1, n_2, \ldots, n_M$, each bounded from below by two, such that for all $i \in \{1, \ldots, M\}$ $$l_i = \prod_{j=1}^{i} n_j,$$

it is possible to show that the average parsed phrase length satisfies the following:

$$E[L] = \left(1 - p_1 \sum_{i=1}^{M} \frac{n_i - 1}{(1/p_0)^{l_i} - 1}\right)^{-1}.$$

For $p_0$ sufficiently close to one, the argument that led to equation 11 implies that the optimal values of $n_M$ and $l_{M-1}$ have the relationship:

$$n_M^* = \sqrt{\frac{2}{l_{M-1}^*(1/p_0)} + \frac{1}{3} + \frac{o(\sqrt{\ln(1/p_0)})}{\sqrt{\ln(1/p_0)}}}.$$

For M equal to two, and for $p_0$ sufficiently close to one, the following has been established:

$$n_1^* \approx n_2^* \approx \sqrt[3]{\frac{2}{\ln(1/p_0)}}.$$

Therefore, it is believed that:

$$n_i^* = \Theta\left(\left(\frac{1}{\sqrt{\ln(1/p_0)}}\right)^{\frac{1}{M+1}}\right).$$

$$E[L] = \Theta\left(\left(\frac{1}{\sqrt{\ln(1/p_0)}}\right)^{\frac{M}{M+1}}\right).$$

Non-Binary Discrete, Memoryless Sources

The renewal theory approach to analyzing and designing plurally parsable dictionaries suggested herein for binary, memoryless sources can be generalized to arbitrary discrete, memoryless sources in which one symbol occurs considerably more often than the others. Suppose the source alphabet is {0, 1, . . . , K-1} and 0 is the most probable symbol. Consider the subset of dictionaries with the property that any entry contains at most one non-zero symbol and every entry with a non-zero symbol ends with it. For these dictionaries, the non-zero symbols in the source sequence form regeneration points in the parsing process. Let E[R] denote the expected number of parsed phrases after a non-zero symbol up to and including the next non-zero symbol. The generalization of equation 12 is then $E[L] = \{(1-p_0)E[R]\}^{-1}$.

Figure 2:
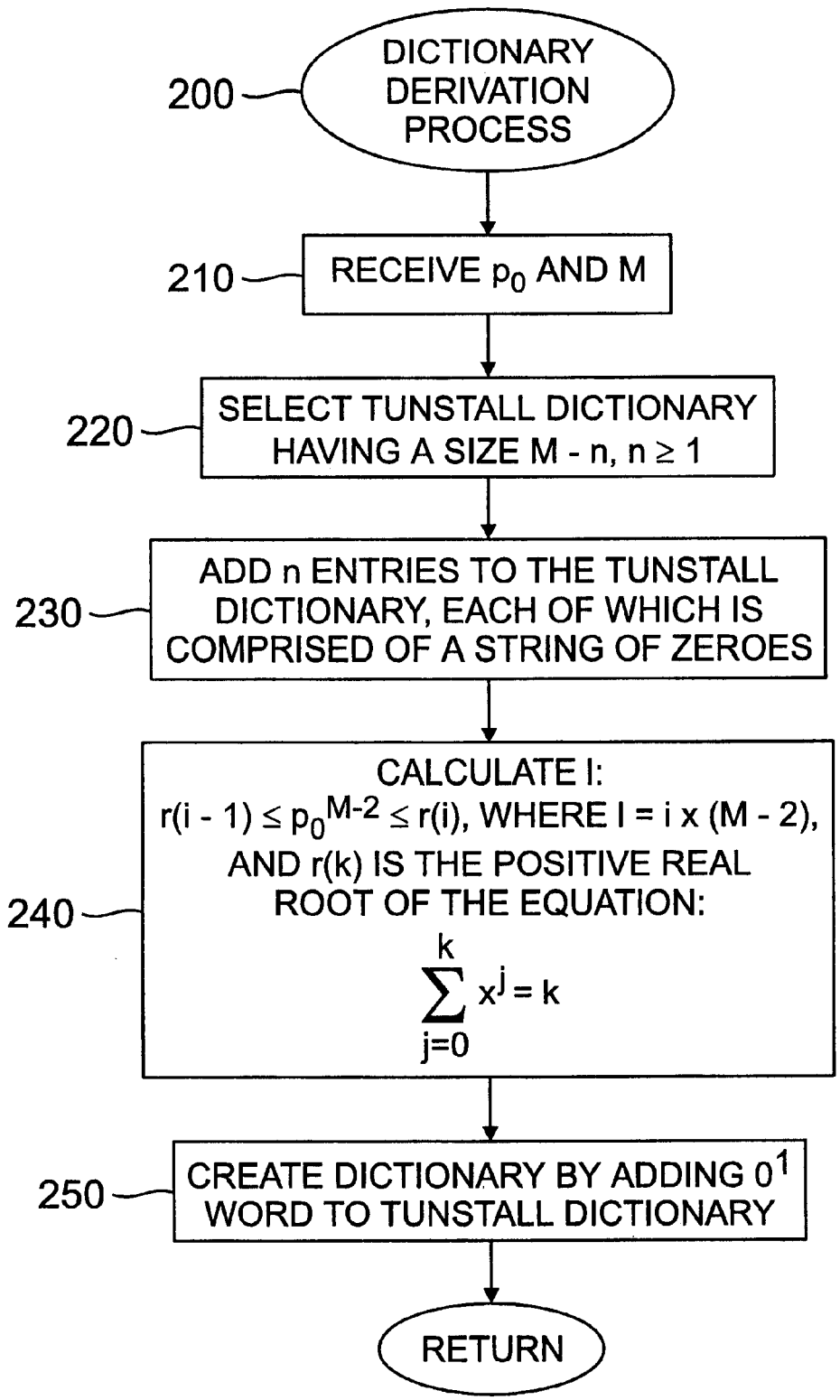
FIG. 2 is a flow chart describing an exemplary dictionary derivation process, performed by the data compression system of FIG. 1.

As previously indicated, the data compression system 100 includes a dictionary derivation process 200 that derives a dictionary that provides better compression than the Tunstall dictionary, if such a better dictionary exists, given the probability of a 0, $p_0$, and the desired size of the dictionary, M, the dictionary derivation process 200. As shown in FIG. 2, the dictionary derivation process 200 initially receives the values of the probability of a 0, $p_0$, and the desired size of the dictionary, M, during step 210. Thereafter, the dictionary derivation process 200 selects a Tunstall dictionary having a size M−n, where n≧1, during step 220. Typically, n has a value of one.

During step 230, n entries are added to the Tunstall dictionary, where each of the entries are comprised of a string of zeroes. For the typical case where n equals one, the entry is comprised of a string of l zeroes. The value of l is obtained during step 240 from the following equation, where l=i×(M−2):

$$r(i-1) \leq p_0^{M-2} \leq r(i),$$

where r(k) is the positive real root of the equation:

$$\sum_{j=0}^{k} x^j = k$$

The dictionary is created during step 250 by adding the all zero words $0^l$ word for n=1) to the Tunstall dictionary, before program control returns to the calling function (the data compression process 150).

It is to be understood that the embodiments and variations shown and described herein are merely illustrative of the principles of this invention and that various modifications may be implemented by those skilled in the art without departing from the scope and spirit of the invention.

I claim:

1. A method for deriving a dictionary of size M for use in data compression, said method comprising the steps of:
   selecting a Tunstall dictionary having a size M−1; and
   adding an entry to said Tunstall dictionary, wherein said entry is a string of zeroes.

2. The method of claim 1, wherein the string of zeroes has a length l obtained from the following equation, where l=i × (M−2):

$$r(i-1) \leq p_0^{M-2} \leq r(i),$$

where r(k) is the positive real root of the equation:

$$\sum_{j=0}^{k} x^j = k$$

and $p_i$ denotes the probability that a symbol has a binary value i.

3. The method of claim 1, further comprising the step of ensuring, that the probability, $p_0$, that a symbol has a binary value of zero satisfies the following condition:

$$\frac{(i-1)p_o^{(i-1)(M-2)}(1-p_0^{M-1})}{1-p_0^{i(M-2)}} \geq \frac{1-p_0}{1-p_0^{M-2}}.$$

4. The method of claim 1, wherein said dictionary is comprised of the following entries: $\{0^{M-2}, 0^l, 0^{M-3}1, \ldots, 01, 1\}$.

5. A method for deriving a dictionary of size M for use in data compression, said method comprising the steps of:

selecting a Tunstall dictionary having a size less than M; and
adding at least one entry to said Tunstall dictionary, each of said entries comprised of a string of zeroes.

6. The method of claim 5, further comprising the step of ensuring that the probability, $p_0$, that a symbol has a binary value of zero satisfies the following condition:

$$\frac{(i-1)p_o^{(i-1)(M-2)}(1-p_0^{M-1})}{1-p_0^{i(M-2)}} \geq \frac{1-p_0}{1-p_0^{M-2}}.$$

7. A method for deriving a dictionary having three codewords for use in data compression, said method comprising the steps of:
   selecting a Tunstall dictionary having two codewords; and
   adding an entry to said Tunstall dictionary comprised of a string of l zeroes, where l is obtained from the following equation:

$$r(l-1) \leq p_0 \leq r(l),$$

and where r(l) is the positive real root of the following equation:

$$\sum_{i=0}^{l} x^i = l$$

and $p_i$ denotes the probability that a symbol has a binary value i.

8. The method of claim 7, wherein said dictionary is comprised of the following entries: $\{0, 0^l, 1\}$.

9. The method of claim 7, further comprising the step of ensuring that the probability, $p_0$, that a symbol has a binary value of zero satisfies the following condition:

$$\left(1 - \frac{p_1(l-1)}{(1/p_0)^l - 1}\right)^{-1} = \left(1 - \frac{p_0^l(l-1)}{\sum_{i=0}^{l-1} p_0^i}\right)^{-1} > 1 + p_0.$$

10. A system for deriving a dictionary of size M for use in data compression, comprising:
    a memory for storing computer-readable code; and
    a processor operatively coupled to said memory, said processor configured to implement said computer-readable code, said computer-readable code configured to:
    select a Tunstall dictionary having a size M−1; and
    add an entry to said Tunstall dictionary, wherein said entry is a string of zeroes.

11. A system for deriving a dictionary of size M for use in data compression, comprising:
    a memory for storing computer-readable code; and
    a processor operatively coupled to said memory, said processor configured to implement said computer-readable code, said computer-readable code configured to:
    select a Tunstall dictionary having a size less than M; and
    add at least one entry to said Tunstall dictionary, each of said entries comprised of a string of zeroes.

12. A system for deriving a dictionary having three codewords for use in data compression, comprising:
    a memory for storing computer-readable code; and a processor operatively coupled to said memory, said processor configured to implement said computer-readable code, said computer-readable code configured to:

select a Tunstall dictionary having two codewords; and add an entry to said Tunstall dictionary comprised of a string of l zeroes, where l is obtained from the following equation:

$$\sum_{i=0}^{l} x^i = l$$

and where $p_i$ denotes the probability that a symbol has a binary value i.

* * * * *